United States Patent
Lee

(10) Patent No.: US 8,634,262 B2
(45) Date of Patent: Jan. 21, 2014

(54) WORD LINE DRIVING SIGNAL CONTROL CIRCUIT, SEMICONDUCTOR MEMORY APPARATUS HAVING THE SAME, AND WORD LINE DRIVING METHOD

(75) Inventor: In Pyo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 99 days.

(21) Appl. No.: 13/337,452

(22) Filed: Dec. 27, 2011

(65) Prior Publication Data

US 2012/0314519 A1 Dec. 13, 2012

(30) Foreign Application Priority Data

Jun. 7, 2011 (KR) .................. 10-2011-0054468

(51) Int. Cl.
*G11C 29/00* (2006.01)
*G11C 17/18* (2006.01)
*G11C 8/00* (2006.01)

(52) U.S. Cl.
USPC .............. 365/200; 365/225.7; 365/230.06

(58) Field of Classification Search
USPC .................. 365/200, 225.7, 230.06
See application file for complete search history.

(56) References Cited

U.S. PATENT DOCUMENTS

| 4,885,720 | A  | * | 12/1989 | Miller et al. | 365/200 |
| 5,978,291 | A  | * | 11/1999 | Kirihata | 365/200 |
| 6,084,807 | A  | * | 7/2000 | Choi | 365/200 |
| 6,094,381 | A  | * | 7/2000 | Isa | 365/200 |
| 6,392,937 | B2 | * | 5/2002 | Nagai | 365/200 |
| 6,819,607 | B2 | * | 11/2004 | Mukai et al. | 365/200 |
| 7,466,621 | B2 | * | 12/2008 | Lee | 365/230.06 |
| 7,602,661 | B2 | * | 10/2009 | Kim | 365/200 |
| 8,050,133 | B2 | * | 11/2011 | Yun et al. | 365/230.06 |
| 8,089,812 | B2 | * | 1/2012 | Kim et al. | 365/225.7 |

FOREIGN PATENT DOCUMENTS

| KR | 1020040038230 A | 5/2004 |
| KR | 100921826 B1 | 10/2009 |

* cited by examiner

*Primary Examiner* — Trong Phan
(74) *Attorney, Agent, or Firm* — William Park & Associates Patent Ltd.

(57) ABSTRACT

A word line driving signal control circuit of a semiconductor memory apparatus provided with a sub-redundancy cell array includes a fuse unit configured to generate a redundancy enable signal in response to a bank active signal and an address signal, and a repair determination unit configured to activate one of a normal word line driving signal, a redundancy word line driving signal, and a sub-redundancy word line driving signal in response to the bank active signal and the redundancy enable signal.

15 Claims, 6 Drawing Sheets

WORD LINE DRIVING SIGNAL CONTROL CIRCUIT, SEMICONDUCTOR MEMORY APPARATUS HAVING THE SAME, AND WORD LINE DRIVING METHOD

CROSS-REFERENCES TO RELATED APPLICATION

The present application claims priority under 35 U.S.C. §119(a) to Korean application number 10-2011-0054468 filed on Jun. 7, 2011 in the Korean Intellectual Property Office, which is incorporated by reference in its entirety.

BACKGROUND

1. Technical Field

The present invention relates to a semiconductor integrated circuit, and more particularly, to a word line driving signal control circuit, a semiconductor memory apparatus having the same, and a word line driving method.

2. Related Art

A semiconductor memory apparatus includes memory cells with high capacity, and has a memory area divided into a plurality of mats having a designated unit size for efficient control.

FIG. 1 is a diagram explaining an example of a memory area applied to a semiconductor memory apparatus.

The memory area may be divided into a plurality of mats mat 0 to mat n. For example, mats may be provided for memory cells connected between a plurality of word lines and a plurality of bit lines. The number of mats may be a refresh unit (8 k, for example 1) divided by a row size (the number of word lines) of a mat.

In the case of a memory area with a row size of 512, since 8 k/512=16, 16 mats may be provided. When a column size is 512, a unit mat size is 256 kb (=512 rows*512 columns).

With the high integration of a semiconductor memory apparatus, a unit mat size has increased. However, as the mat size increases, bit line loading may increase to a point where a normal operation may not be possible. Accordingly, there is a limitation in the selection of the mat size. Typically a mat size of 640 or 768 is employed.

FIG. 2 is a diagram explaining another example of a memory area applied to a semiconductor memory apparatus. A row size of 768 will be used in the following examples, but it should be noted that the invention need not be limited to that row size.

10 mats (mat 0 to mat m, m=9) corresponding to a refresh unit (8 k, for example) divided by a row size of 768 may be provided. In order to form a redundant mat of memory cells, which are coupled to 512 word lines in one mat, it is necessary to add 256 word lines and memory cells corresponding to the 256 word lines. For the redundant mat formed in this way, only the 512 word lines are actually used for an operation, and the additionally formed 256 word lines are not actually used.

Since a semiconductor memory apparatus includes a plurality of memory cells, if a defect occurs in one of the plurality of memory cells, the semiconductor memory apparatus has no value as a product. Thus, when a redundancy memory cell is additionally provided and a defect occurs, a failed cell is replaced with a redundancy memory cell.

To this end, a failed cell is found through a test process. Then, an address signal corresponding to the failed cell is replaced with an address signal of a redundancy cell.

FIG. 3 is a configuration diagram of a general word line driving signal control circuit.

A word line driving signal control circuit 10 includes a fuse unit 12 and a repair determination unit 14.

The fuse unit 12 includes a plurality of fuses. The fuse unit 12 outputs a redundancy enable signal XHITB according to the state of a fuse corresponding to an address signal BXAR in response to the address signal BXAR, a fuse enable signal FEN, and a bank active signal BACT.

The repair determination unit 14 outputs a normal word line driving signal WLEN or a redundancy word line driving signal RWLEN in response to the redundancy enable signal XHITB, the bank active signal BACT, and a word line off signal WLOFF. The word line off signal WLOFF is a word line control signal, and provides a normal word line driver or a redundancy word line driver with the normal word line driving signal WLEN or the redundancy word line driving signal RWLEN.

However, since a redundancy cell is fabricated in the same manner as a normal cell, a defect may also occur in the redundancy cell. If a defect occurs in the redundancy cell, it is not possible to repair a corresponding memory apparatus.

As described above, after some failed cells of a plurality of memory cells are replaced with redundancy cells, if a defect occurs in the redundancy cells, a memory apparatus may be discarded, resulting in the reduction of a product yield and the waste of a resource.

SUMMARY

In one embodiment of the present invention, a word line driving signal control circuit of a semiconductor memory apparatus including a sub-redundancy cell array includes a fuse unit configured to generate a redundancy enable signal in response to a bank active signal and an address signal, and a repair determination unit configured to activate one of a normal word line driving signal, a redundancy word line driving signal, and a sub-redundancy word line driving signal in response to the bank active signal and the redundancy enable signal.

In another embodiment of the present invention, a semiconductor memory apparatus includes a memory cell array including a normal cell array, a redundancy cell array, and a sub-redundancy cell array, and a word line driving signal control circuit configured to select one of the normal cell array, the redundancy cell array, and the sub-redundancy cell array in response to an address signal and a bank active signal.

In another embodiment of the present invention, a word line driving method of a semiconductor memory apparatus including a normal cell array, a redundancy cell array, and a sub-redundancy cell array includes accessing the normal cell array through a main word line driver when a normal cell is normal, accessing the redundancy cell array through a redundancy word line driver when the normal cell has been repaired, and accessing the sub-redundancy cell array through a sub-redundancy word line driver when a redundancy cell has been repaired.

BRIEF DESCRIPTION OF THE DRAWINGS

Features, aspects, and embodiments are described in conjunction with the attached drawings.

DETAILED DESCRIPTION

A word line driving signal control circuit, a semiconductor memory apparatus having the same, and a word line driving method according to the present invention will be described in detail with reference to the accompanying drawings through exemplary embodiments.

When a word line driving signal control circuit according to an embodiment of the invention is applied to a semiconductor memory apparatus, the semiconductor memory apparatus may include a sub-redundancy memory cell area in addition to a normal cell area and a redundancy memory cell area. In addition, the sub-redundancy memory cell area may include redundancy memory cells provided in the normal cell area. Specifically, when a memory area of the semiconductor memory apparatus is configured using a plurality of mats with a designated unit size, memory cells added in order to match the unit size may be called redundancy memory cells, where the redundancy memory cells may be used as sub-redundancy cells.

Figure 1:
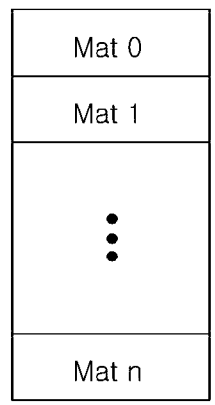
FIG. 1 is a diagram explaining an example of a memory area applied to a semiconductor memory apparatus.
Figure 2:
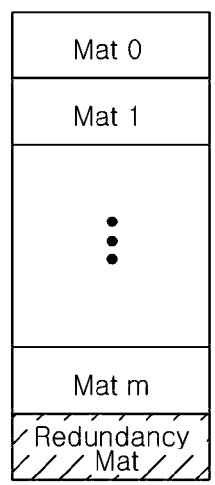
FIG. 2 is a diagram explaining another example of a memory area applied to a semiconductor memory apparatus.
Figure 3:
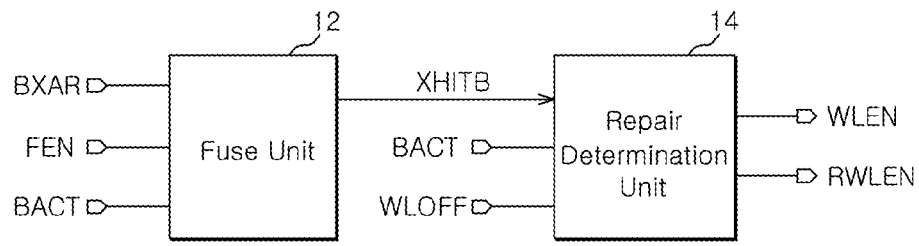
FIG. 3 is a configuration diagram of a general word line driving signal control circuit.
Figure 4:
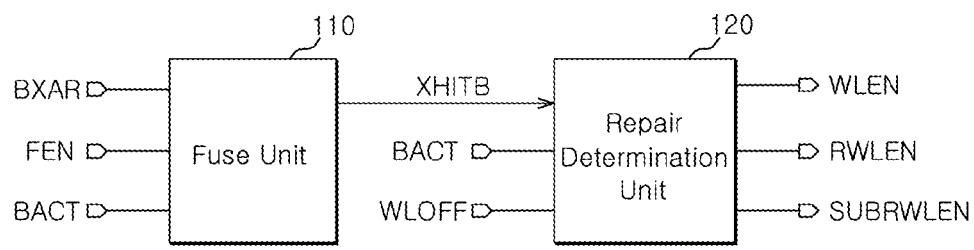
FIG. 4 is a configuration diagram of an exemplary word line driving signal control circuit according to an embodiment of the invention.

FIG. 4 is a configuration diagram of an exemplary word line driving signal control circuit according to an embodiment of the invention.

A word line driving signal control circuit 100 according to an embodiment of the invention includes a fuse unit 110 and a repair determination unit 120.

The fuse unit 110 is configured to output a redundancy enable signal XHITB according to the state of a fuse corresponding to an address signal BXAR in response to the address signal BXAR, a fuse enable signal FEN, and a bank active signal BACT.

The repair determination unit 120 is configured to output a normal word line driving signal WLEN, a redundancy word line driving signal RWLEN, or a sub-redundancy word line driving signal SUBRWLEN in response to the redundancy enable signal XHITB, the bank active signal BACT, and a word line off signal WLOFF. The normal word line driving signal WLEN may be provided to a normal word line driver, the redundancy word line driving signal RWLEN may be provided to a redundancy word line driver, and the sub-redundancy word line driving signal SUBRWLEN may be provided to a sub-redundancy word line driver.

Figure 5:
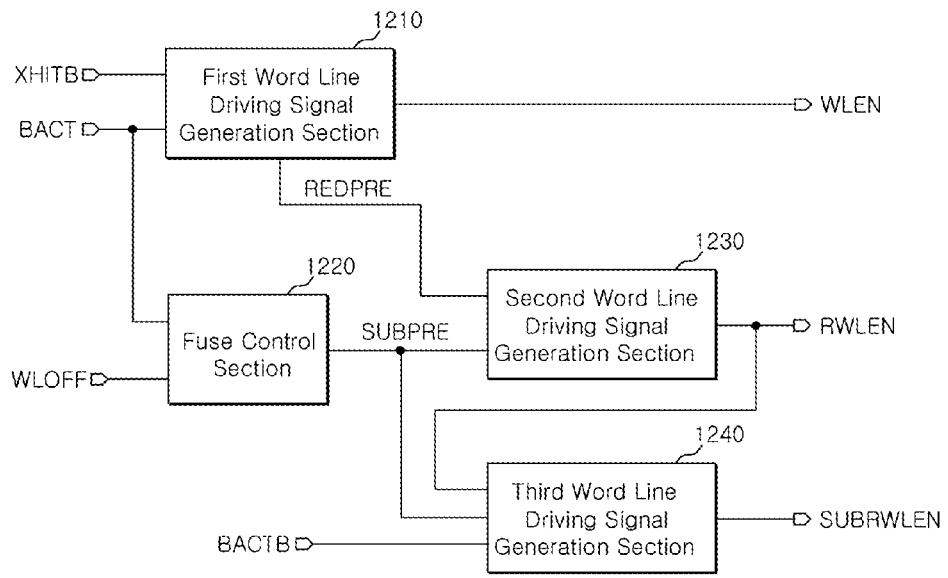
FIG. 5 is a configuration diagram of an exemplary repair determination unit illustrated in FIG. 4.

The exemplary repair determination unit 120, for example, may be configured as illustrated in FIG. 5.

Referring to FIG. 5, the repair determination unit 120 includes a first word line driving signal generation section 1210, a fuse control section 1220, a second word line driving signal generation section 1230, and a third word line driving signal generation section 1240. The first word line driving signal generation section 1210 is configured to output the normal word line driving signal WLEN according to the presence or absence of repair in response to the redundancy enable signal XHITB and the bank active signal BACT. The fuse control section 1220 is configured to output a sub-redundancy word line enable signal SUBPRE according to the state of a fuse, which is cut according to the presence or absence of repair using a sub-redundancy memory cell, in response to the bank active signal BACT and the word line off signal WLOFF. The second word line driving signal generation section 1230 is configured to output the redundancy word line driving signal RWLEN according to the state of the fuse which is cut according to the presence or absence of repair using the sub-redundancy memory cell. The third word line driving signal generation section 1240 is configured to output the sub-redundancy word line driving signal SUBRWLEN according to a redundancy word line driving signal, the state of the fuse which is cut according to the presence or absence of repair using the sub-redundancy memory cell, and a bank active signal.

Figure 6:
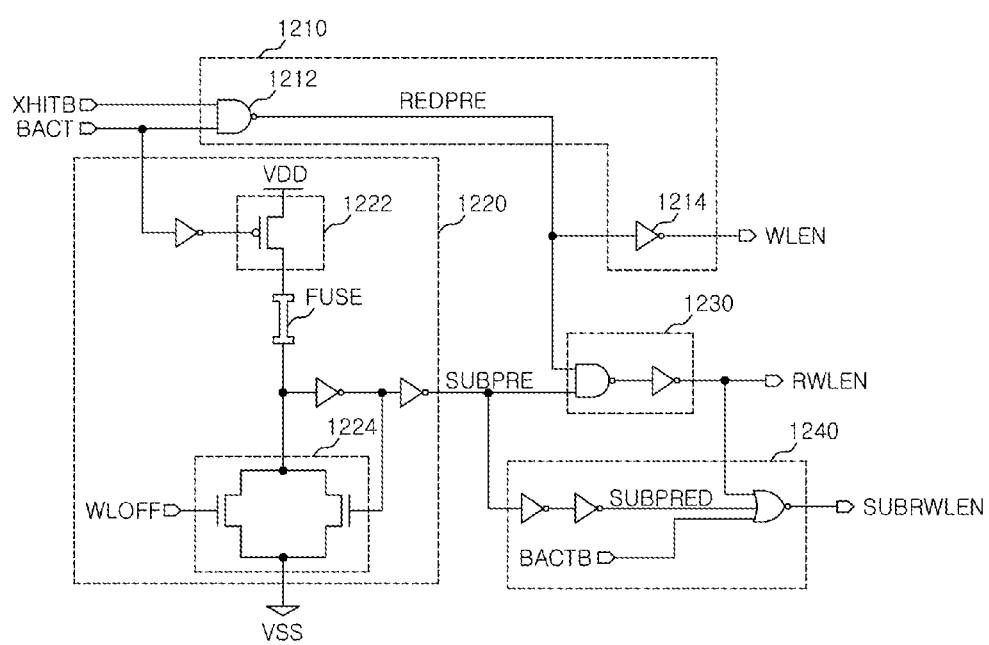
FIG. 6 is a diagram illustrating an example of a repair determination unit illustrated in FIG. 4 and FIG. 5.

FIG. 6 is a diagram illustrating an example of the repair determination unit illustrated in FIG. 4 and FIG. 5.

Referring to FIG. 6, the first word line driving signal generation section 1210 includes a first determination part 1212 and an output part 1214. The first determination part 1212 is configured to determine the presence or absence of repair in response to the redundancy enable signal XHITB and the bank active signal BACT, and output a repair determination signal REDPRE. The output part 1214 is configured to output an output signal of the first determination part 1212 as the normal word line driving signal WLEN.

The fuse control section 1220 includes a fuse driving part 1222 and a fuse state determination part 1224. The fuse driving part 1222 is configured to drive a fuse FUSE in response to the bank active signal BACT. The fuse state determination part 1224 is configured to output the sub-redundancy word line enable signal SUBPRE according to the state of the fuse FUSE in response to the word line off signal WLOFF.

The second word line driving signal generation section 1230 outputs the redundancy word line driving signal RWLEN in response to the repair determination signal REDPRE, which is the output signal of the first determination part 1212, and the sub-redundancy word line enable signal SUBPRE.

The third word line driving signal generation section 1240 outputs the sub-redundancy word line driving signal SUBRWLEN in response to the redundancy word line driving signal RWLEN, a delay signal SUBPRED of the sub-redundancy word line enable signal, and an inverted signal BACTB of the bank active signal BACT.

When repair has not occurred for a normal cell, the redundancy enable signal XHITB output from the fuse unit 110 of FIG. 4 is at a high level. Accordingly, when the bank active signal BACT is activated to a high state, the first word line driving signal generation section 1210 activates the normal word line driving signal WLEN to a high state.

When a defect is found in a normal cell and repair has occurred, the fuse unit 110 having received the address signal BXAR instructing a corresponding memory cell outputs the redundancy enable signal XHITB to a low level. In this case, the repair determination signal REDPRE, which is the output signal of the first determination part 1212, enters a high state, and the normal word line driving signal WLEN, which is an output signal of the first word line driving signal generation section 1210, enters a low state.

In addition, the fuse driving part 1222 is turned on according to the bank active signal BACT. Whether the fuse FUSE has been cut is determined according to the presence or absence of repair using the sub-redundancy memory cell.

When the repair using the sub-redundancy memory cell has not occurred, the fuse substantially maintains an uncut state. Since the word line off signal WLOFF substantially maintains a low state according to a precharge command, the sub-redundancy word line enable signal SUBPRE is at a high level.

As a consequence, the second word line driving signal generation section 1230 activates the redundancy word line driving signal RWLEN to a high level in response to the repair determination signal REDPRE, which is the output signal of the first determination part 1212, and the sub-redundancy word line enable signal SUBPRE.

When the repair using the sub-redundancy memory cell has occurred, the fuse FUSE is in a cut state, and the sub-redundancy word line enable signal SUBPRE is at a low level. Consequently, the third word line driving signal generation section 1240 activates the sub-redundancy word line driving signal SUBRWLEN to a high level in response to the redundancy word line driving signal RWLEN, the sub-redundancy word line enable signal SUBPRE, and the inverted signal BACTB of the bank active signal, and thereby driving the sub-redundancy word line driver.

In brief, in the case of using a normal cell that does not need to be repaired, since the redundancy enable signal XHITB is at a high level, the repair determination unit 120 activates the normal word line driving signal WLEN, thereby driving the normal word line driver.

When a repair is made using the redundancy memory cell, since the redundancy enable signal XHITB is activated to a low level and the fuse FUSE having repair information on a sub-redundancy word line is in an uncut state, the redundancy word line driving signal RWLEN is activated to drive the redundancy word line driver.

In addition, when a repair using the sub-redundancy memory cell has occurred, since the redundancy enable signal XHITB is at the low level and the fuse FUSE is in a cut state, the sub-redundancy word line driver is driven by the sub-redundancy word line driving signal SUBRWLEN.

Figure 7:
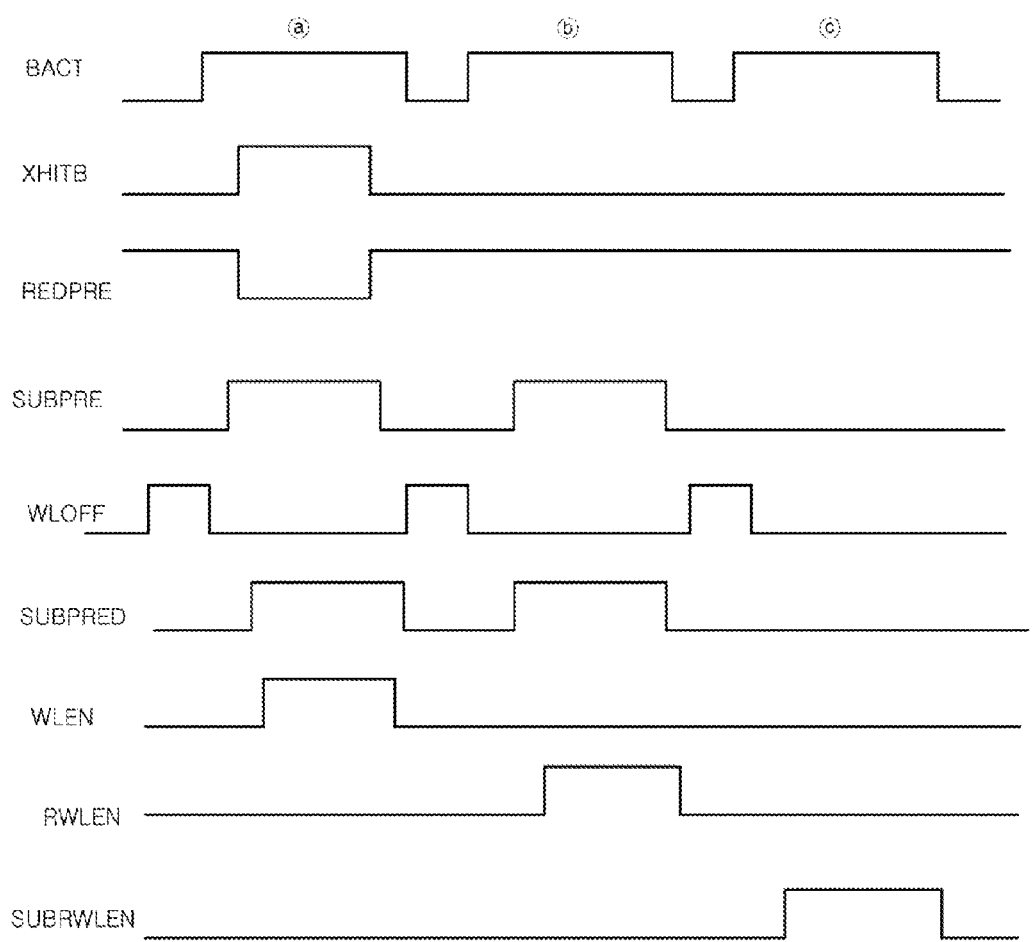
FIG. 7 is a timing diagram explaining a word line driving signal control method according to an embodiment of the invention.

FIG. 7 is a timing diagram explaining a word line driving signal control method according to an embodiment of the invention.

When repair has not occurred for a normal cell ((a)), that is, when the bank active signal BACT is activated and the redundancy enable signal XHITB is at a high level, the normal word line driving signal WLEN is at a high level.

Meanwhile, when a defect is found in a normal cell and repair has occurred ((b)), that is, when the bank active signal BACT is activated and the redundancy enable signal XHITB is at a low level, the repair determination signal REDPRE is at a high level. In this condition, when the fuse is in an uncut state, the redundancy word line driving signal RWLEN is at a high level.

When the repair using the sub-redundancy memory cell has occurred ((c)), that is, when the bank active signal BACT is activated and the redundancy enable signal XHITB is at a low level, the repair determination signal REDPRE is at the high level. When the fuse is in a cut state, the sub-redundancy word line driving signal SUBRWLEN is at a high level.

Figure 8:
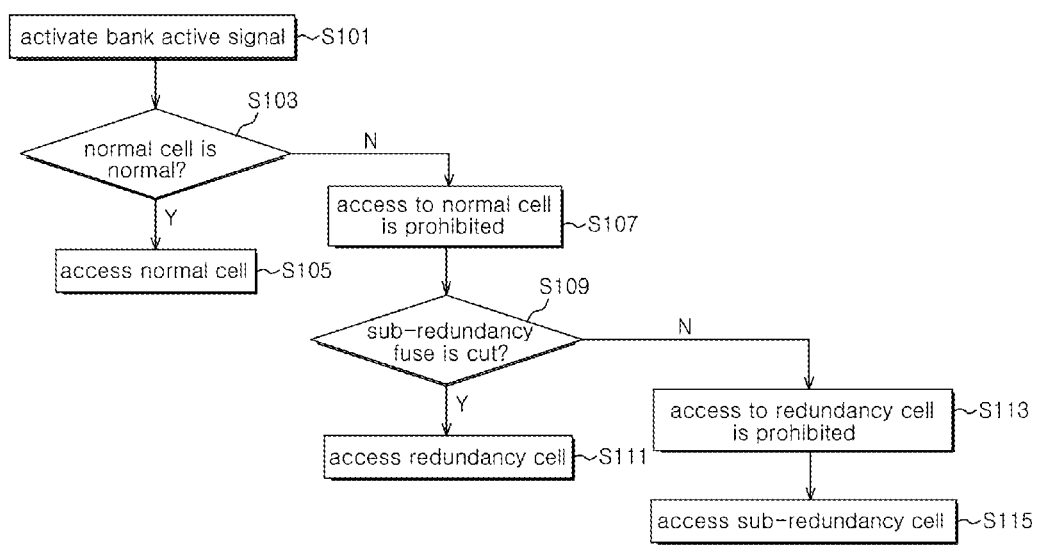
FIG. 8 is a flowchart explaining a word line driving method according to an embodiment of the invention.

FIG. 8 is a flowchart explaining a word line driving method according to an embodiment of the invention.

The bank active signal BACT is activated to perform a predetermined operation in a memory area of the semiconductor memory apparatus (S101), the fuse unit 110 compares the bank active signal BACT with the address signal BXAR of a memory cell to be accessed, and determines the presence or absence of repair (S103).

When the repair has not occurred, that is, when a normal cell operates normally, the normal cell corresponding to a corresponding address is accessed and a desired operation is performed (S105).

When repair has occurred, an access to the normal cell is prohibited (S107) and it is checked whether a redundancy cell is in a normal state (S109). That is, it is checked whether the redundancy cell is normal according to a fuse state with information on repair using the sub-redundancy word line.

When the redundancy cell is normal, the redundancy cell having replaced the normal cell is accessed and a desired operation is performed (S111). If the redundancy cell has also failed, an access to the redundancy cell prohibited (S113), and an access to a sub-redundancy cell is accessed and a desired operation is performed (S115).

Figure 9:
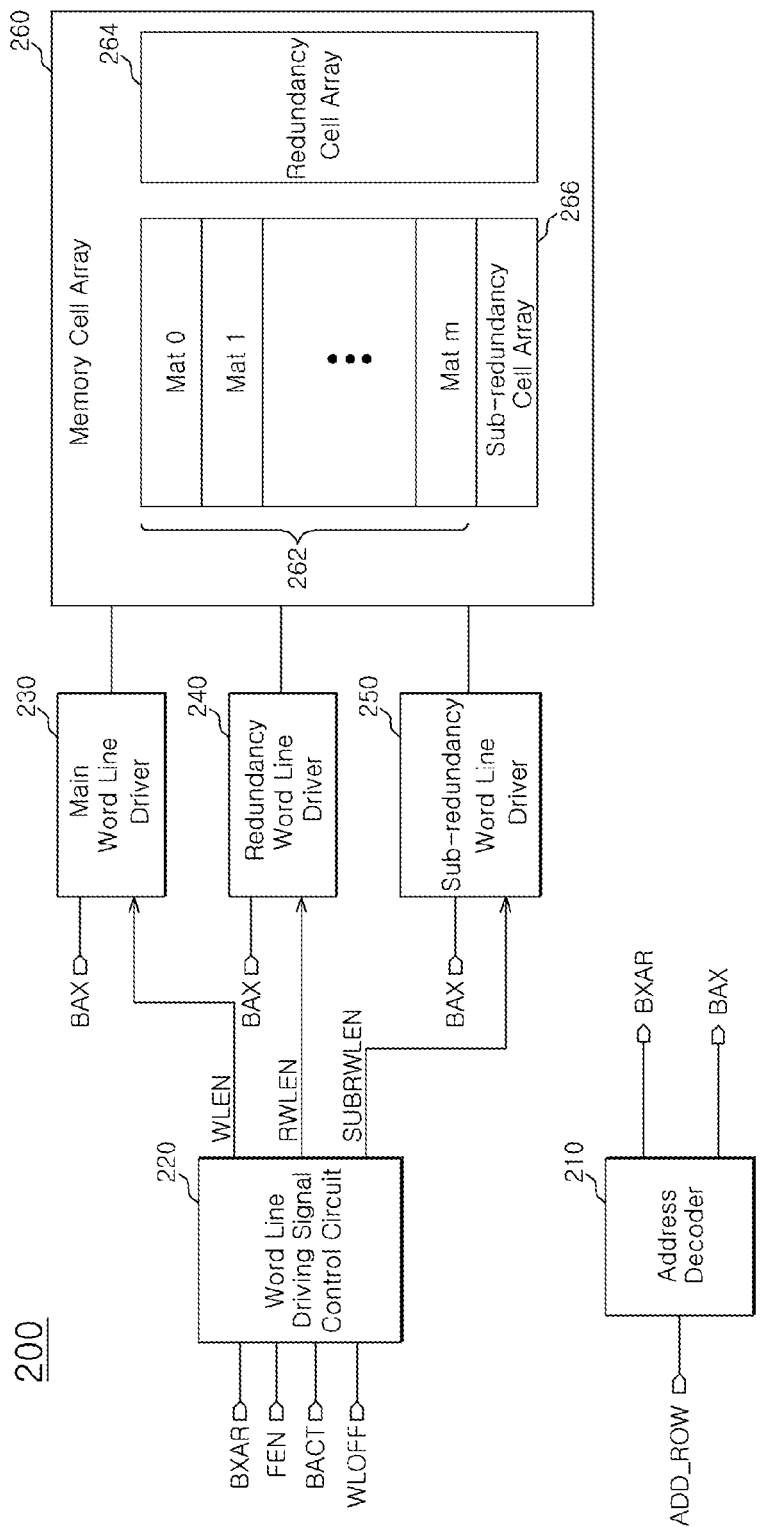
FIG. 9 is a diagram explaining an exemplary semiconductor memory apparatus according to an embodiment of the invention.

FIG. 9 is a diagram explaining an exemplary semiconductor memory apparatus according to an embodiment of the invention.

A semiconductor memory apparatus 200 according to an embodiment of the invention includes an address decoder 210, a word line driving signal control circuit 220, a main word line driver 230, a redundancy word line driver 240, a sub-redundancy word line driver 250, and a memory cell array 260.

The address decoder 210 is configured to decode an external row address ADD_ROW and generate a first address signal BXAR and a second address signal BAX. The number of bits of the row address ADD_ROW may be, for example, 13. Among the 13 bits, the ADD_ROW<2:12> may be decoded to generate the first address signal BXAR, and the ADD_ROW<0:1> may be decoded to generate the second address signal BAX. A part of the second address signal BAX is provided to a sub-word line driver (not illustrated) and is used to determine a sub-word line to be driven among a plurality of sub-word lines belonging to one main word line. A remaining part of the second address signal BAX is proved to the main word line driver 230, the redundancy word line driver 240, and the sub-redundancy word line driver 250, and is used to determine a main word line to be driven.

The word line driving signal control circuit 220 is configured to activate one of the normal word line driving signal WLEN, the redundancy word line driving signal RWLEN, and the sub-redundancy word line driving signal SUBRWLEN in response to the first address signal BXAR, the fuse enable signal FEN, the bank active signal BACT, and the word line off signal OFF.

The main word line driver 230 is configured to be driven according to the normal word line driving signal WLEN, and drive a word line according to the second address signal BAX. The redundancy word line driver 240 is configured to be driven according to the redundancy word line driving signal RWLEN, and drive the word line according to the second address signal BAX. The sub-redundancy word line driver 250 is configured to be driven according to the sub-redundancy word line driving signal SUBRWLEN, and drive the word line according to the second address signal BAX.

The memory cell array 260 further includes a normal cell array 262 and a redundancy cell array 264, and further includes a sub-redundancy cell array 266.

Specifically, the sub-redundancy cell array 266 may include redundancy memory cells provided in the normal cell array 262. Specifically, when a memory area of the semiconductor memory apparatus is configured using a plurality of mats with a designated unit size, memory cells added in order to match the unit size may be used as the sub-redundancy cell array 266.

In FIG. 9, the word line driving signal control circuit 220 may be realized using the word line driving signal control circuit 100 illustrated in FIGS. 4 to 6.

When the first address signal BXAR and the second address signal BAX are generated by the address decoder 210 and the bank active signal BACT is activated, the word line driving signal control circuit 220 determines whether to access the normal cell array 262, the redundancy cell array 264, or the sub-redundancy cell array 266 by the redundancy enable signal XHITB having a logic level determined according to the presence or absence of repair.

When the redundancy enable signal XHITB is at a high level, indicating that repair has not occurred, the word line driving signal control circuit 220 activates the normal word line driving signal WLEN to drive the main word line driver 230. The main word line driver 230 drives a corresponding main word line and a sub-word line belonging to the corresponding main word line according to the second address signal BAX, and applies a word line voltage to the selected normal cell array 262.

Meanwhile, when the redundancy enable signal XHITB is at a low level, indicating that the repair has occurred, the redundancy word line driving signal RWLEN or the sub-redundancy word line driving signal SUBRWLEN is activated according to the state of the fuse FUSE illustrated in FIG. 6. If the fuse FUSE is in an uncut state and the repair using the redundancy cell array 264 has occurred, the word line driving signal control circuit 220 activates the redundancy word line driving signal RWLEN to drive the redundancy word line driver 240. Thus, the redundancy word line driver 240 drives a redundancy word line designated by the second address signal BAX.

When the fuse FUSE is in a cut state, the sub-redundancy word line driving signal SUBRWLEN is activated, so that the sub-redundancy word line driver 250 is driven to drive a sub-redundancy word line corresponding to the second address signal BAX.

As described above, the memory cell array includes the sub-redundancy cell array 266. When a defect has occurred in the redundancy cell array 264, an access path to the redundancy cell array 264 is changed to the sub-redundancy cell array 266. Consequently, repair is possible even when a defect has occurred in the redundancy cell array 264, resulting in the improvement of a product yield of the semiconductor memory apparatus.

Moreover, the sub-redundancy cell array 266 may include redundancy cells that may not be used in a normal operation among cells constituting the normal cell array 262, so that it is possible to improve repair efficiency without the loss of a net die.

While certain embodiments have been described above, it will be understood to those skilled in the art that the embodiments described are by way of example only. Accordingly, the word line driving signal control circuit, the semiconductor memory apparatus having the same, and the word line driving method described should not be limited based on the described embodiments. Rather, the word line driving signal control circuit, the semiconductor memory apparatus having the same, and the word line driving method described should only be limited in light of the claims that follow when taken in conjunction with the above description and accompanying drawings.

What is claimed is:

1. A word line driving signal control circuit of a semiconductor memory apparatus including a normal cell array, a redundancy cell array, and a sub-redundancy cell array, the word line driving signal control circuit comprising:

a fuse unit configured to generate a redundancy enable signal in response to a bank active signal and an address signal; and a repair determination unit configured to activate one of a normal word line driving signal to access the normal cell array, a redundancy word line driving signal to access the redundancy cell array, and a sub-redundancy word line driving signal to access the sub-redundancy cell array in response to the bank active signal and the redundancy enable signal.

2. The word line driving signal control circuit according to claim 1, wherein the repair determination unit comprises:

a first word line driving signal generation section configured to determine whether a normal cell has been repaired according to the redundancy enable signal and the bank active signal, and to output the normal word line driving signal;

a fuse control section configured to output a sub-redundancy word line enable signal according to a cutting state of a fuse, which is cut according to presence or absence of repair using a sub-redundancy memory cell, in response to the bank active signal and a word line control signal;

a second word line driving signal generation section configured to output the redundancy word line driving signal in response to an output signal of the first word line driving signal generation section and an output signal of the fuse control section; and a third word line driving signal generation section configured to output the sub-redundancy word line driving signal in response to the redundancy word line driving signal, the output signal of the fuse control section, and the bank active signal.

3. The word line driving signal control circuit according to claim 2, wherein the first word line driving signal generation section comprises:

a first determination part configured to output a repair determination signal indicating whether the normal cell has been repaired, in response to the redundancy enable signal and the bank active signal; and an output part configured to output an output signal of the first determination part as the normal word line driving signal.

4. The word line driving signal control circuit according to claim 2, wherein the fuse control section comprises:

a fuse driving part configured to drive the fuse in response to the bank active signal; and a fuse state determination part configured to output the sub-redundancy word line enable signal according to the cutting state of the fuse in response to the word line control signal.

5. The word line driving signal control circuit according to claim 1, wherein the semiconductor memory apparatus comprises:

a normal cell array; and
a redundancy cell array,
wherein the sub-redundancy cell array is part of a normal cell array area.

6. A semiconductor memory apparatus comprising:

a memory cell array including a normal cell array, a redundancy cell array, and a sub-redundancy cell array; and a word line driving signal control circuit configured to select one of the normal cell array, the redundancy cell array, and the sub-redundancy cell array in response to an address signal and a bank active signal.

7. The semiconductor memory apparatus according to claim 6, wherein at least a portion of the normal cell array is replaced with at least a portion of the redundancy cell array.

8. The semiconductor apparatus according to claim 6, wherein at least a portion of the redundancy cell array replaced with at least a portion of the sub-redundancy cell array.

9. The semiconductor memory apparatus according to claim 6, wherein the sub-redundancy cell array is part of a normal cell array area.

10. The semiconductor memory apparatus according to claim 6, wherein the word line driving signal control circuit comprises:
    a fuse unit configured to generate a redundancy enable signal in response to the address signal and the bank active signal; and
    a repair determination unit configured to activate one of a normal word line driving signal, a redundancy word line driving signal, and a sub-redundancy word line driving signal in response to the bank active signal and the redundancy enable signal.

11. The semiconductor memory apparatus according to claim 10, wherein the repair determination unit comprises:
    a first word line driving signal generation section configured to determine whether a normal cell has been repaired according to the redundancy enable signal and the bank active signal, and to output the normal word line driving signal;
    a fuse control section configured to output a sub-redundancy word line enable signal according to a cutting state of a fuse, which is cut according to presence or absence of repair using a sub-redundancy memory cell, in response to the bank active signal and a word line control signal;
    a second word line driving signal generation section configured to output the redundancy word line driving signal in response to an output signal of the first word line driving signal generation section and an output signal of the fuse control section; and
    a third word line driving signal generation section configured to output the sub-redundancy word line driving signal in response to the redundancy word line driving signal, the output signal of the fuse control section, and the bank active signal.

12. A word line driving method of a semiconductor memory apparatus including a normal cell array, a redundancy cell array, and a sub-redundancy cell array, the word line driving method comprising:
    accessing the normal cell array through a main word line driver when a normal cell is normal;
    accessing the redundancy cell array through a redundancy word line driver when the normal cell has been repaired; and
    accessing the sub-redundancy cell array through a sub-redundancy word line driver when a redundancy cell has been repaired.

13. The word line driving method according to claim 12, wherein the sub-redundancy cell array is part of a normal cell array area.

14. The word line driving method according to claim 12, wherein it is determined whether the normal cell has been repaired according to a row address of a normal memory cell to be accessed in response to a bank active signal.

15. The word line driving method according to claim 14, wherein, when the normal cell has been repaired, it is determined whether the redundancy cell has been repaired by checking a state of a fuse that stores repair information of a sub-redundancy word line.

\* \* \* \* \*